United States Patent [19]

Mantele

[11] Patent Number: 5,014,023
[45] Date of Patent: May 7, 1991

[54] NON-DISPERSIVE VARIABLE PHASE SHIFTER AND VARIABLE LENGTH TRANSMISSION LINE

[75] Inventor: John E. Mantele, Laguna Niguel, Calif.

[73] Assignee: Hughes Aircraft Company, Los Angeles, Calif.

[21] Appl. No.: 329,997

[22] Filed: Mar. 29, 1989

[51] Int. Cl.$^5$ .................. H03H 11/20; H01Q 3/22
[52] U.S. Cl. ........................... 333/164; 333/161; 342/372
[58] Field of Search ............. 333/161, 164, 246, 247, 333/138–140; 357/14; 342/371, 372, 375; 343/757, 778

[56] References Cited

U.S. PATENT DOCUMENTS

| | | | |
|---|---|---|---|
| 3,246,265 | 4/1966 | Smith-Vaniz | 333/161 |
| 3,260,968 | 7/1966 | Drapkin | 333/139 |
| 3,748,499 | 7/1973 | Schaffner | 333/139 X |
| 4,604,591 | 8/1986 | Vasile | 333/164 X |
| 4,649,393 | 3/1987 | Rittenbach | 333/164 X |
| 4,701,714 | 10/1987 | Agoston | 333/139 X |
| 4,837,532 | 8/1989 | Lang | 333/161 X |

Primary Examiner—Eugene R. LaRoche
Assistant Examiner—Seung Ham
Attorney, Agent, or Firm—Leonard A. Alkov; Wanda K. Denson-Low

[57] ABSTRACT

A varactor controlled phase shifter device is disclosed wherein the phase velocities through the device are substantially equal at all frequencies, thus resulting in the phase constant of the phase shifter device being proportional to frequency. The magnitude of phase shift is selectable over a predetermined range by a continuously variable external control voltage, and this phase shift is linearly proportional to frequency. The device may also be used as a variable length transmission line, useful for such applications as frequency selective impedance matching.

22 Claims, 5 Drawing Sheets

NON-DISPERSIVE VARIABLE PHASE SHIFTER AND VARIABLE LENGTH TRANSMISSION LINE

BACKGROUND OF THE INVENTION

The present invention relates to microwave frequency phase shifters, and more particularly to an improved phase shifter which is non-dispersive, and the amount of phase shift is selectable over a predetermined range by an external control signal.

Phase shifters based on the variable capacitance of varactor diodes are commonplace. See, e.g., "Analog Phase Shifter for 8-18 GHz," S. Hopper, Microwave Journal, March 1979, page 48-50. Existing designs are either narrow band, frequency dispersive, have high insertion losses, or are non-reciprocal in operation.

Current procurement trends for airborne radar and electronic warfare equipment stress increasingly wider instantaneous frequency bandwidths for the antenna systems, the limit of which will ultimately be determined strictly by the inventiveness of the industry. At present, it is possible to achieve a 3:1 (115.4%) instantaneous bandwidth using a Rotman lens steered beam array. Rotman lenses are described, for example, in "Wide angle Lens for Line Source Applications," Rotman, W. and Turner, R. F., IEEE Trans. Antennas and Propagation, Vol. AP-11, 1963, pages 623-632. However, the full potential of this antenna system is severely limited, due to the lack of a wideband phase shifter which can angularly resolve the coarse beam steering increment associated with the Rotman lens.

SUMMARY OF THE INVENTION

It would therefore be advantageous to have a variable phase shifter whose operation is not frequency dispersive and is reciprocal, and which has relatively low insertion loss.

It would further be an advantage to provide a device which provides a transmission line whose electrical length can be selectively, electronically varied.

A further advantage would be provided by a wideband phase shifter capable of angularly resolving the coarse beam steering increments provided by such beam steering networks as a Rotman lens and multi-bit switched line phase shifters.

The subject invention avoids the foregoing problems by obtaining the variable phase shift in a transmission line medium and by restricting the range of varactor diode capacitance variation. These two actions effectively result in a transmission line whose propagation constant can be continuously varied over a limited range, thereby producing an extremely low loss, wideband, non-dispersive phase shift in either direction of line propagation.

The variable phase shift device in accordance with the invention comprises a transmission line having two conductors, and characterized by an intrinsic distributed capacitance between the two conductors. A plurality of varactor diodes are connected periodically in parallel between the two conductors, thereby placing the diodes in parallel with the intrinsic distributed capacitance of the transmission line.

An external voltage control signal is applied to the diodes in order to back bias the diodes. By varying the reverse bias level, the diode capacitance is also varied, thereby also producing a change in the phase constant of the transmission line and providing a relative phase shift. By limiting the amount of capacitance change, the change in the characteristic impedance of the transmission line is kept to a level which does not result in a substantial impedance mismatch.

In one embodiment, the transmission line is implemented as a microstrip transmission line, with the varactor diodes comprising discrete diode chips. In an alternative monolithic arrangement, a semiconductor substrate such as gallium arsenide (GaAs) is formed on the microstrip ground plane, and varactor diodes are formed in the substrate by discrete ion implantation.

Non-dispersive variable phase shifter devices in accordance with the invention are particularly well suited to steer phased array antenna beams. Other applications of devices embodying the invention include serving as a variable length transmission line.

BRIEF DESCRIPTION OF THE DRAWINGS

These and other features and advantages of the present invention will become more apparent from the following detailed description of exemplary embodiments thereof, as illustrated in the accompanying drawings, in which.

DETAILED DESCRIPTION OF THE PREFERRED EMBODIMENTS

The subject invention comprises a non-dispersive R.F. phase shifter device employing varactor diodes, whose phase can be varied over a specified range by means of an external control voltage. This voltage provides a reverse bias to the varactor diodes, thereby controlling the capacitance of the varactor diodes. The diodes are connected periodically between the conductors of a transmission line, which places the diodes in parallel with the intrinsic distributed capacitance of the line. The device can also be used to provide a transmission line whose electrical length can be varied.

OVERVIEW OF THE INVENTION

An examination of the following transmission line equations will show how the variable phase shift is produced by the varactor diodes. The characteristic impedance and propagation constant of a uniform (distributed parameters) transmission line are respectively:

$$Z_o = ((R+j\omega L)/(G+j\omega C))^{\frac{1}{2}} \quad (1)$$

$$\gamma = \alpha + j\beta = ((R+j\omega L)(G+j\omega C))^{\frac{1}{2}} \quad (2)$$

Where:
$Z_o$ = characteristic impedance (ohms)
$\gamma$ = propagation constant (dimensionless)
$\alpha$ = attenuation constant (nepers/unit length)
$\beta$ = phase constant (radians/unit length)
R = resistance of conductors (ohms/unit length)
L = inductance of conductors (henries/unit length)
C = capacitance between conductors (farads/unit length)
G = leakage conductance of dielectric (mhos/unit length)
$\omega = 2\pi f$ (radians/second)
f = frequency (hertz/second).

It can be seen from Eq. (1) and Eq. (2) that a change in capacitance C, while keeping all other parameters constant, will produce a change to both the characteristic impedance and the propagation constant of the transmission line. It is in this basic manner that by changing the capacitance of the varactor diodes, a change will be produced in the phase constant of the transmission line, thus providing a relative phase shift. Since the characteristic impedance of the line also changes with changes in the varactor capacitance, the magnitude of the capacitance change must be limited; otherwise a significant mismatch would occur between the phase shifter transmission line and the connecting transmission line, which would result in increasing the insertion loss of the phase shifter.

THE PREFERRED EMBODIMENTS

Figure 1:
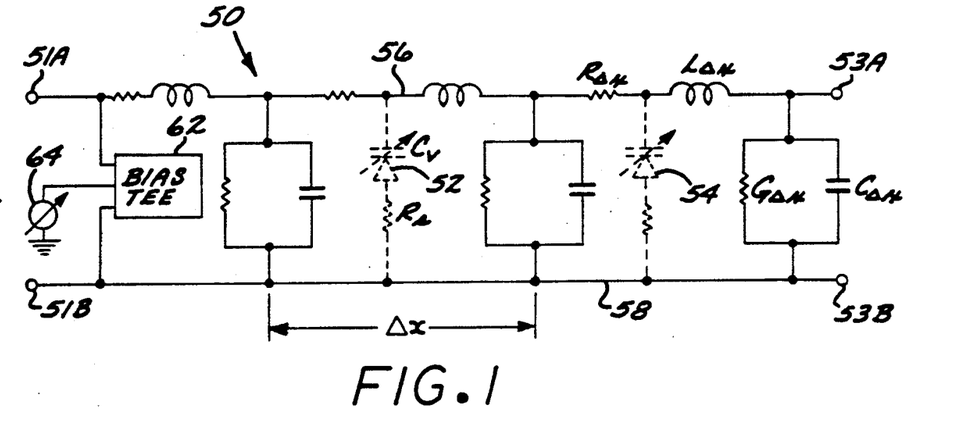
FIG. 1 is a simplified schematic diagram of a variable phase shift device in accordance with the invention.

The basic configuration of the invention is shown in FIG. 1, which depicts a simplified schematic of the approximate representation of a short section of transmission line 50 having distributed parameters, which also has two varactor diodes 52 and 54 (shown in dashed outline) connected across the conductors 56 and 58 of the transmission line. The distributed parameters of the transmission line 50 are designated as R$\Delta$x, L$\Delta$x, G$\Delta$x, and C$\Delta$x. Each of the varactor diodes 52 and 54 is depicted as a variable capacitance $C_v$ in series with a resistance $R_s$. This series resistance $R_s$ corresponds to the losses produced by the leakage conductance of the varactor diode, which is a function of the "Q" of the varactor diode at the frequency of operation, i.e., $R_s = 1/\omega CQ$.

The phase shifter of FIG. 1 is a two-port device, one port at nodes 51A and 51B, the other port at nodes 53A and 53B. The device operates reciprocally in that microwave energy may be propagated in either direction, i.e., from the first port to the second port or vice versa.

A reverse bias control signal is applied to the transmission 50 to control the capacitance of the varactor diodes. A variable voltage source 64 is coupled to the conductors 56 and 58 via a conventional bias tee 62 to develop the desired reverse bias voltage on the varactor diodes 52, 54. The purpose of the bias tee 62 is to isolate the bias control signal from the microwave energy whose phase shift is being controlled. The range in voltage levels will depend on the particular varactor diode employed; one exemplary broad range for an exemplary varactor diode is between $-1$ and $-60$ volts.

Figure 2:
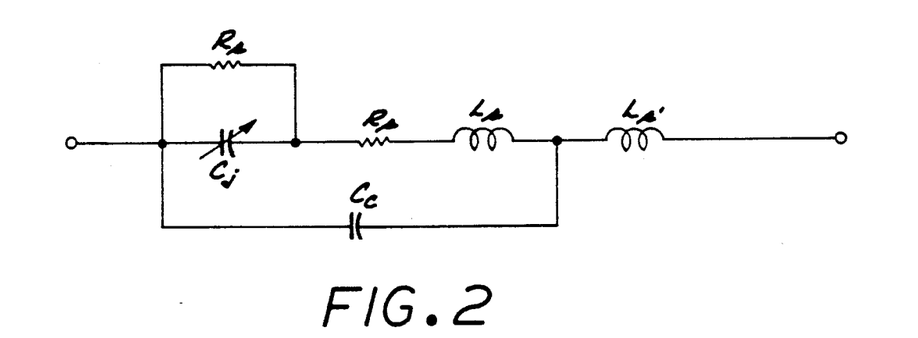
FIG. 2 is a more exact equivalent circuit of a varactor diode then that employed in the schematic diagram of FIG. 1.

In practice, the equivalent circuit of the reversebiased varactor diode is more complicated than as shown in FIG. 1. A more exact equivalent circuit is shown in FIG. 2 from which it can be seen that the varactor diode has the following electrical parameters.
$C_j$ = Voltage variable Junction Capacitance.
$R_p$ = Parallel resistance or back resistance of diode.
$R_s$ = Bulk resistance of semiconductor material.
$L_s'$ = External lead inductance.
$L_s$ = Internal lead inductance (omit for chip diodes).
$C_c$ = Case capacitance (omit for chip diodes).

Figure 3:
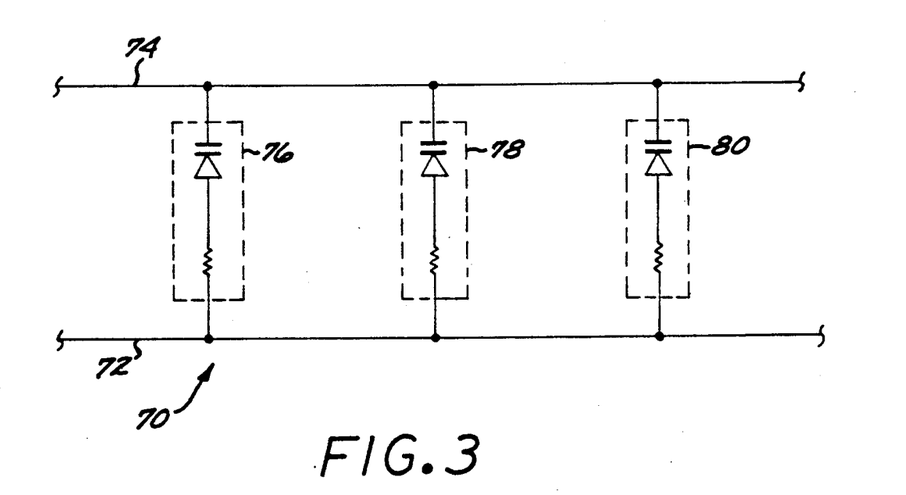
FIG. 3 is a simplified schematic drawing of an embodiment of the variable phase shift device implemented with microstrip transmission line and discrete varactor diode chips.

A computer simulation has been conducted for an exemplary postulated phase shifter device 70, comprising a microstrip transmission line having conductors 72 and 74, and three (3) GaAs abrupt junction varactor tuning diode chips 76, 78 and 80. These diodes comprise the model MA-46620K diodes marketed by M/A-Com, Burlington, Mass., which have a Q of 10,000 at 50 MHz, which translates to a Q of 28 at 18 GHz (i.e., Q(f)=50 MHz/frequency $\times$ 10,000). It is understood that Pacific Monolithic, 245 Santa Ana Court, Sunnyvale, Calif. 94086, has recently developed a gallium arsenide varactor diode having a Q of 75,000 at 50 MHz. Such a diode would offer improved performance when used in devices embodying the invention. The postulated design also took into account the lead inductance of the wire connecting the varactor diode chips to the conductors 74 and 76 of the microstrip transmission line. The schematic of this postulated circuit is shown in FIG. 3. The particular microwave network analysis software program employed to perform the simulation is the "Touchstone" brand program marketed by the EEsof Company. The computer description of the parameters of the device 70 is shown in Table I.

TABLE I

! VARACTOR = MA 44620 CHIP. Q @ 50 MHz = 10,000.
DIM
FREQ GHZ             3 DIODE CONFIGURATION
RES OH
IND NH
CAP PF
LNG MIL
TIME PS
COND /OH
ANG DEG
VAR
C1 = 0.06           REFERENCE CAPACITANCE
R1 = 2.00
X = 30
C2 = 0.141 VARIABLE CAPACITANCE: 0.06 pf to 0.141 pf
CKT
MSUB ER = 2.2 H = 10'T = 0.34 RHO = 1 RGH = 0
MLIN     1   2    W = 12 L = 32
DEF2P    1   2    LINE
CAP      1   2    C C1
RES      2   3    R = 12.24
WIRE     3   4    D X L = 5.5 RHO = 1
DEF2P    1   4    VCAP
VCAP     1   0
LINE     1   2
VCAP     2   0
LINE     2   3
VCAP     3   0
DEF2P    1   3    REF
CAP      1   2    C C2
RES      2   3    R R1
WIRE     3   4    D X L = 5.5 RHO = 1
DEF2P    1   4    VCAP1
VCAP1    1   0
LINE     1   2
VCAP1    2   0
LINE     2   3

TABLE I-continued

| | | | |
|---|---|---|---|
| VCAP1 | 3 | 0 | |
| DEF2P | 1 | 3 | NET |

The computer predicted performance of the device, characterized by phase shift and insertion loss, is shown in Table II, over the frequency range of 6 GHz to 18 GHz.

TABLE II

| FREQ-GHZ | DB[S21] | ANG[S21] PSHIFT | |
|---|---|---|---|
| 6.00000 | 0.034 | −9.5E-03 | |
| 7.00000 | 0.046 | −0.014 | |
| 8.00000 | 0.060 | −0.020 | |
| 9.00000 | 0.075 | −0.026 | |
| 10.0000 | 0.093 | −0.032 | |
| 11.0000 | 0.113 | −0.039 | Varactor capacitance set |
| 12.0000 | 0.134 | −0.047 | for minimum phase shift. |
| 13.0000 | 0.158 | −0.054 | |
| 14.0000 | 0.185 | −0.063 | |
| 15.0000 | 0.214 | −0.072 | |
| 16.0000 | 0.245 | −0.084 | |
| 17.0000 | 0.279 | −0.099 | |
| 18.0000 | 0.317 | −0.119 | |
| FREQ-GHZ | DB[S21] | ANG[S21] PSHIFT | |
| 6.00000 | 0.183 | −12.268 | |
| 7.00000 | 0.218 | −14.051 | |
| 8.00000 | 0.243 | −15.778 | |
| 9.00000 | 0.254 | −17.475 | |
| 10.0000 | 0.250 | −19.175 | |
| 11.0000 | 0.228 | −20,815 | Varactor capacitance set |
| 12.0000 | 0.191 | −22.738 | for maximum phase shift. |
| 13.0000 | 0.140 | −24.681 | |
| 14.0000 | 0.080 | −26.781 | |
| 15.0000 | 0.018 | −29.068 | |
| 16.0000 | 0.039 | −31.557 | |
| 17.0000 | 0.082 | −34.246 | |
| 18.0000 | 0.102 | 037.112 | |

To determine the non-dispersive response of a phase shifter in accordance with this invention, the following phased array antenna beam steering equations are considered.

$$\text{Required phase shift} = \phi = (360 \times 8/\lambda) \times \sin \theta \quad (3)$$

where
$S$ = center-to-center spacing between antenna elements.
$\lambda$ = wavelength of operating frequency $\theta$ = beam scan angle.

To prevent grating lobes for scan angles of $= +-60$ degrees, requires that the spacing a must be ½ wavelength maximum, at the highest frequency of operation, i.e., ½ wavelength at 18 GHz = 0.8333 cm.

Equation (3) therefore becomes:

$$\text{For 6 GHz: } \phi(6) = 60 \sin \zeta \quad (4)$$

$$\text{For 18 GHz: } \phi(18) = 180 \sin \theta \quad (5)$$

Conversely, equations (4) and (5) can be rewritten as:

$$\text{For 6 GHz: } \theta(6) = \arcsin \theta(6)/60 \quad (6)$$

$$\text{For 18 GHz: } \theta(16) = \arcsin \theta(18)/180 \quad (7)$$

With reference to Table II, it is seen that there are two separate tabulations, one for the minimum capacitance setting of the varactor diodes, and one for the maximum capacitance setting of the varactor diodes. Each of these tabulations list the insertion loss, DB[S21] and the phase shift, ANG[S21] that is incurred as a function of frequency. The differential phase shift produced by the phase shifter is the difference between the phase shift values corresponding to the two capacitance settings. This differential phase shift at 6 GHz is (12.268 deg. −9.5E−03 deg.) = 12.258 degrees. For 18 GHz, the differential phase shift is (37.112 deg. −0.119 deg.) = 36.993 degrees. Substituting these values into equations 6 and 7, respectively, gives:

6 GHz: $\theta(6) = \arcsin (12.268/60) = 11.798$ degrees

18 GHz: $\theta(18) = \arcsin (36.993/180) = 11.859$ degrees

Therefore, the difference in the antenna beam steering angles due to changing the frequency from 6 GHz to 18 GHz is 0.061 degrees. This calculation therefore confirms that the phase shifter device of this invention is, for all practical purposes, non-dispersive over the entire frequency range of 6 GHz to 18 GHz, and thus the antenna beam pointing angle will be independent of the frequency of operation.

Figure 4:
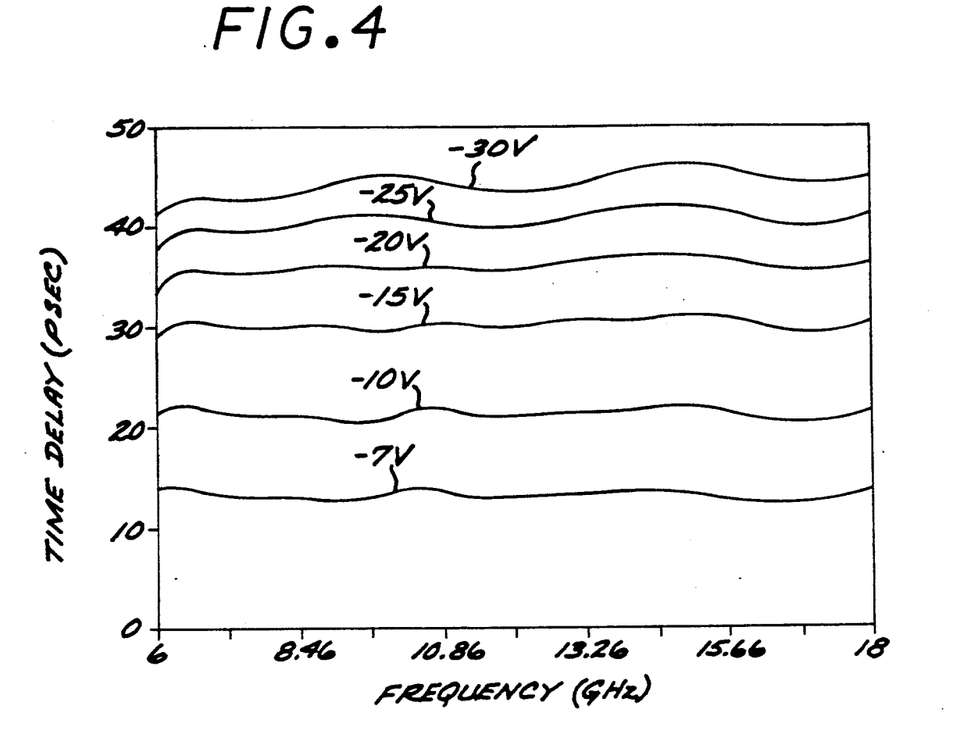
FIGS. 4 and 5 are graphs illustrating the time delay and phase shift swept frequency response of an exemplary phase shifter employing the invention over the frequency range 6-18 GHz.
Figure 5:
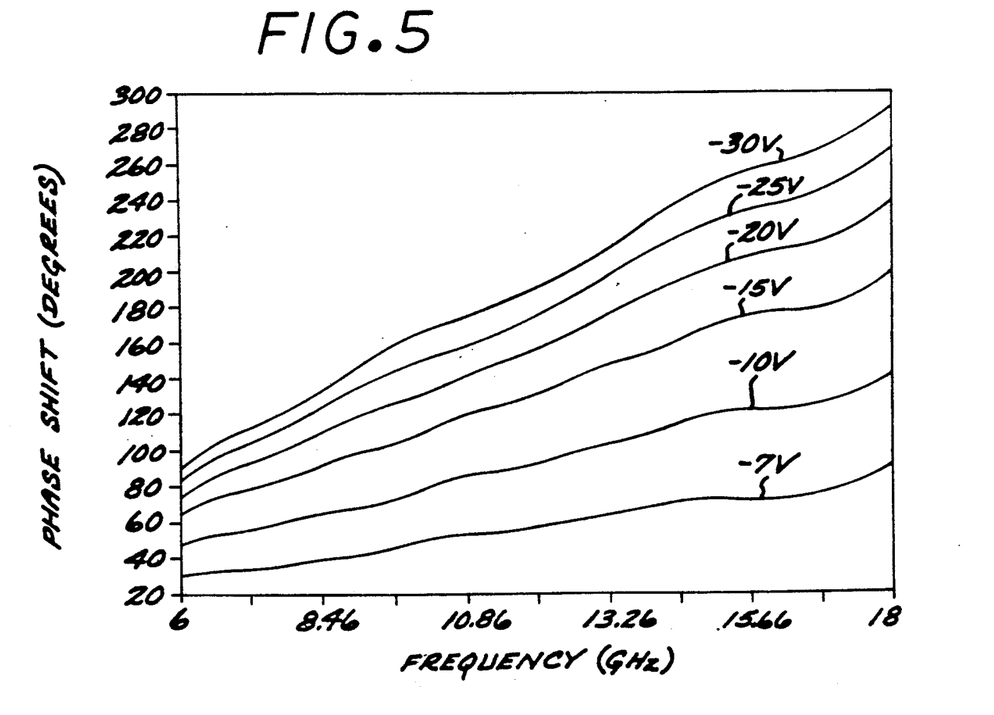

A phase shift device in accordance with the invention has been constructed using silicon discrete varactor diodes having a Q of 5,000. Fourteen diodes were employed, with a typical center-to-center spacing of about 0.014 inches. The device was built in microstrip, using a stepped-transition conductor to achieve impedance matching, as is conventional. In the diode zone, a second ground plane traverse to the microstrip was provided, about 0.2 inches in width, so that the conductor in the diode zone was sandwiched between and insulated from the microstrip ground plane and the traverse ground plane. The diodes were connected between the traverse ground plane and the microstrip conductor. The diode spacing is limited by the physical size of existing available diode chips. The smaller the spacing between diodes, the better the approximation of a uniformly distributed capacitance, and hence the better the resulting performance. The swept time delay and phase shift response of the exemplary device over the 6–18 GHz frequency range and for a range of bias voltage levels is qualitatively illustrated in FIGS. 4 and 5.

It is to be noted that discrete varactor diodes were used in the computer simulated analysis, and the individual connection of the diodes to the transmission line was accounted for by means of an external wire. This wire adds a small inductance in series with the diodes which increases the diode's impedance as a function of frequency. This in turn causes the varactor diodes to perturb the transmission line. In addition, the use of discrete diodes is a lumped approximation of a small section of the transmission line, which when coupled with the connecting lead inductance, causes the transmission line section of the phase shifter to depart from a true distributed parameter transmission line. The net effect is to limit the range of phase shift performance and increase the insertion loss.

In view of the fact that a typical phased array antenna would have multiple-thousands of phase shifters, the us of discrete diodes would be cost prohibitive. The solution to this is to fabricate the phase shifter transmission line using monolithic microwave integrated circuit (MMIC) technology, which in addition to reducing manufacturing costs, would eliminate the lead inductance of the wire connecting the varactor diodes to the transmission line. One exemplary method of fabricating the subject phase shifter using MMIC technology is by discrete ion implantation of varactor diodes in a GaAs substrate; the adjacent spacing can be much closer than individual diode chips. The transmission line for this technique is deposited on top of the varactor diode implant zone, thereby eliminating the connecting lead inductance, resulting in an almost perfect distributed parameter transmission line. Moreover, the diodes can be spaced much closer together than when discrete chips are used, e.g., on the order of 0.005 inch center-to-center spacing.

Figure 6:
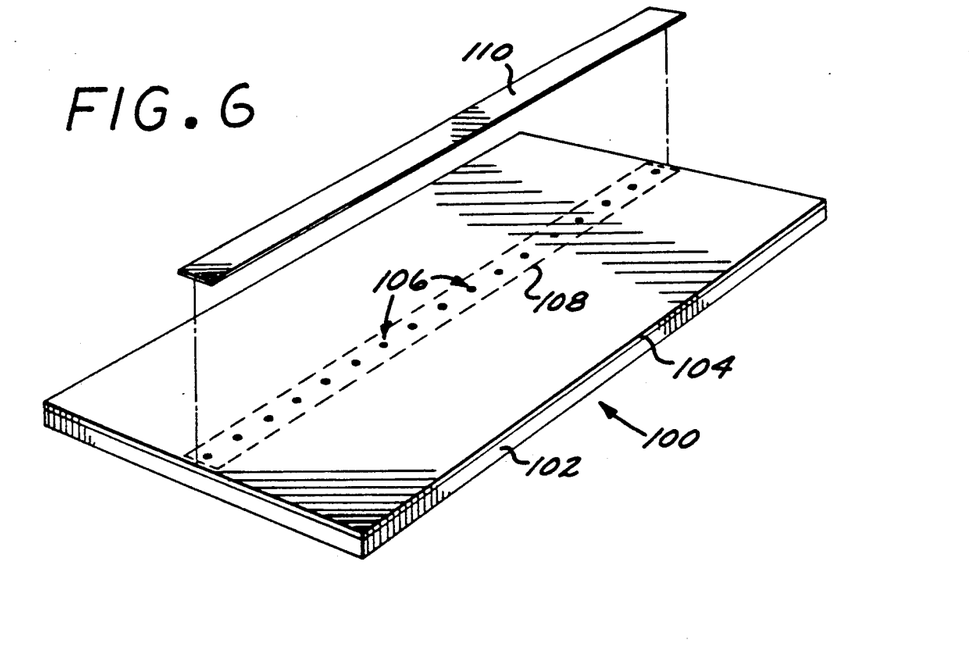
FIG. 6 is a simplified schematic drawing of a monolithic embodiment of the variable phase shift device implemented with microstrip transmission line and ion implantation of discrete varactor diodes on a GaAs substrate.

FIG. 6 illustrates a variable phase shifter 100 in accordance with the invention which employs discrete ion implantation of varactor diodes. The phase shifter 100 comprises the microstrip ground plane 102, and a gallium arsenide (GaAs) substrate layer 104 having a thickness of 0.005 inches formed over the ground plane. A plurality of discrete varactor diodes are formed in an elongated diode zone 108 in the GaAs substrate by ion implantation. An elongated microstrip conductor 110 is then deposited over the varactor diode zone 108. Microwave signals may be inputted and outputted from the phase shift device 100 by conventional means (not shown in FIG. 4), e.g., micro-strip-to-coaxial line transition. As with the devices of FIGS. 1 and 3, the bias voltage control signal is applied to the varactor diodes via a bias tee device (not shown in FIG. 6), connected between the ground phase 102 and the conductor 110. Connection of bias tees and control voltage sources is well known in the art.

The invention applies to any electronic circuitry that requires an externally selectable phase shift which, for a given setting, is linearly proportional to frequency. The invention is particularly well suited to phased array antenna beam steering over extremely wide instantaneous frequency bandwidths. The invention makes it possible to simultaneously obtain an extremely high angular beam pointing resolution and a constant (non-skewing) beam pointing angle, both of which are independent of the frequency of operation.

Figure 7:
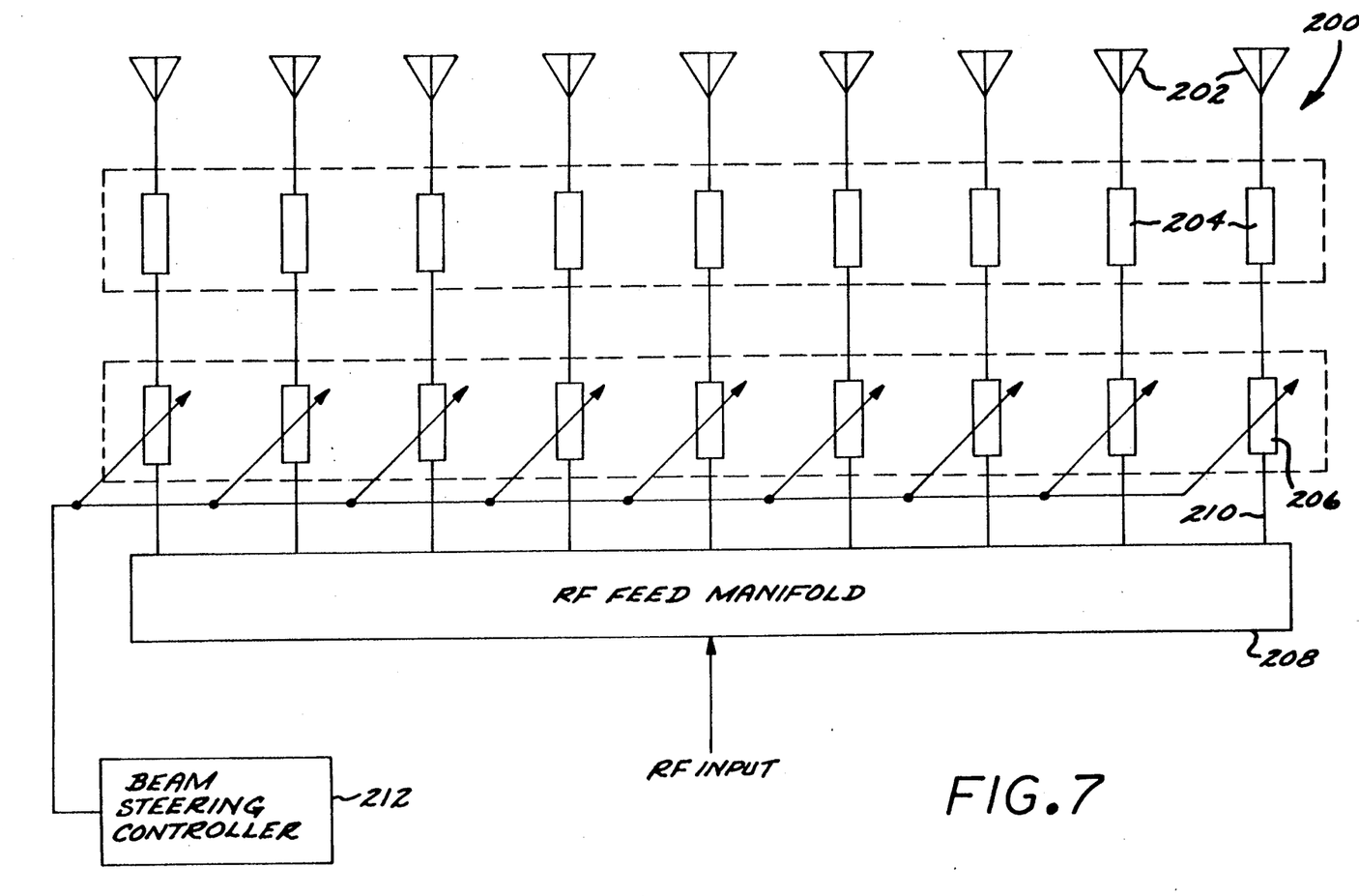
FIG. 7 is a simplified schematic block diagram of a phased array antenna system employing variable phase shift devices embodying the invention.

FIG. 7 is a simplified schematic drawing illustrating a one-dimensional phased array antenna system 200 employing the variable phase shift device in accordance with the invention. The system 200 comprises N radiating elements 202, and a corresponding number N of transmit/receiver modules 204 connected to corresponding one of the radiating elements 202. The RF input to the system 200 is inputted to the RF feed manifold 208. The 1:N feed manifold 208 divides the input signal into N RF signals at the N manifold terminals 210. The manifold terminals 210 are each respectively coupled to an input port of a corresponding one of the transmit/receive modules 204 via a corresponding one of the modulo 2 pi non-dispersive variable phase shifters 206. Thus, the phase shifters provide total phase shift progression over the N radiating elements of 360°. The variable phase shifters 206 are controlled by a beam steering controller 212 to steer the array beam to a desired direction.

The system 200 of FIG. 7 is a conventional active phased array system, except that the conventional beam steering phase shifters have been replaced by non-dispersive phase shifters 206 in accordance with the invention. It will be appreciated that the system is reciprocal in operation, i.e., it receives RF signals as well as transmitting signals. The array beam is steered to a particular direction by the beam steering controller 212, which applies an appropriate back bias to the varactor diodes of the respective variable phase shifters 206 to achieve the desired phase shift for the particular phase shifters. It will be appreciated that signals applied to the respective radiative elements may, depending on the application, be phase shifted to invoke a uniform phase gradient over the array aperture. Thus, the phase shifter devices 206 may differ by $2\pi/N$, requiring a corresponding difference in the bias control signal applied to each phase shifter. The phase shifters 206, for a particular application, may comprise a fixed non-dispersive phase shift device to invoke the desired phase gradient, and a variable phase shifter in accordance with the invention. In that case the variable phase shifters 206 can each be controlled to the same phase shift and still achieve a uniform phase gradient over the aperture.

Since the antenna beam pointing angle for the array system 200 of FIG. 7 is independent of frequency, no correction or look-up tables are required to correlate beam steering with frequency and beam angle. This time saving and software saving aspect is of extreme importance to antenna systems which must simultaneously operate over very wide instantaneous frequency bandwidths, e.g., 3:1, and with 2-dimensional beam scanning of +/−60 degrees in both azimuth and elevation axis.

The invention also makes it possible to steer an antenna beam in vanishingly small increments, the ultimate resolution being limited solely by the stability of the external control voltage which controls the phase shift. For example, a conventional 4-bit switched line (non-dispersive) phase shifter has a least significant bit of 22.5 degrees, but if used with the subject invention, the resulting effective angular resolution can be considerably less than 1/100 degrees. The Rotman lens is another form of non-dispersive beam steering network, which steers the beam in increments of, typically, 20 degrees. The subject invention would also permit resolving these 20 degree increments into substantially less than 1/100 degree increments.

The invention, when used in conjunction with coarse increment beam steering time-delay networks, such as previously discussed, would for all practical purposes, eliminate the short pulse distortion, i.e., amplitude reduction and spreading of the pulse width, due to the aperture "fill-up time" phenomenum that results from the use of narrow pulse widths or wide band signals in a comparatively large aperture phased array antenna. When the time duration of the pulsed signal is less than the fill-up time, only a portion of the aperture is illuminated at a given instant.

Figure 8:
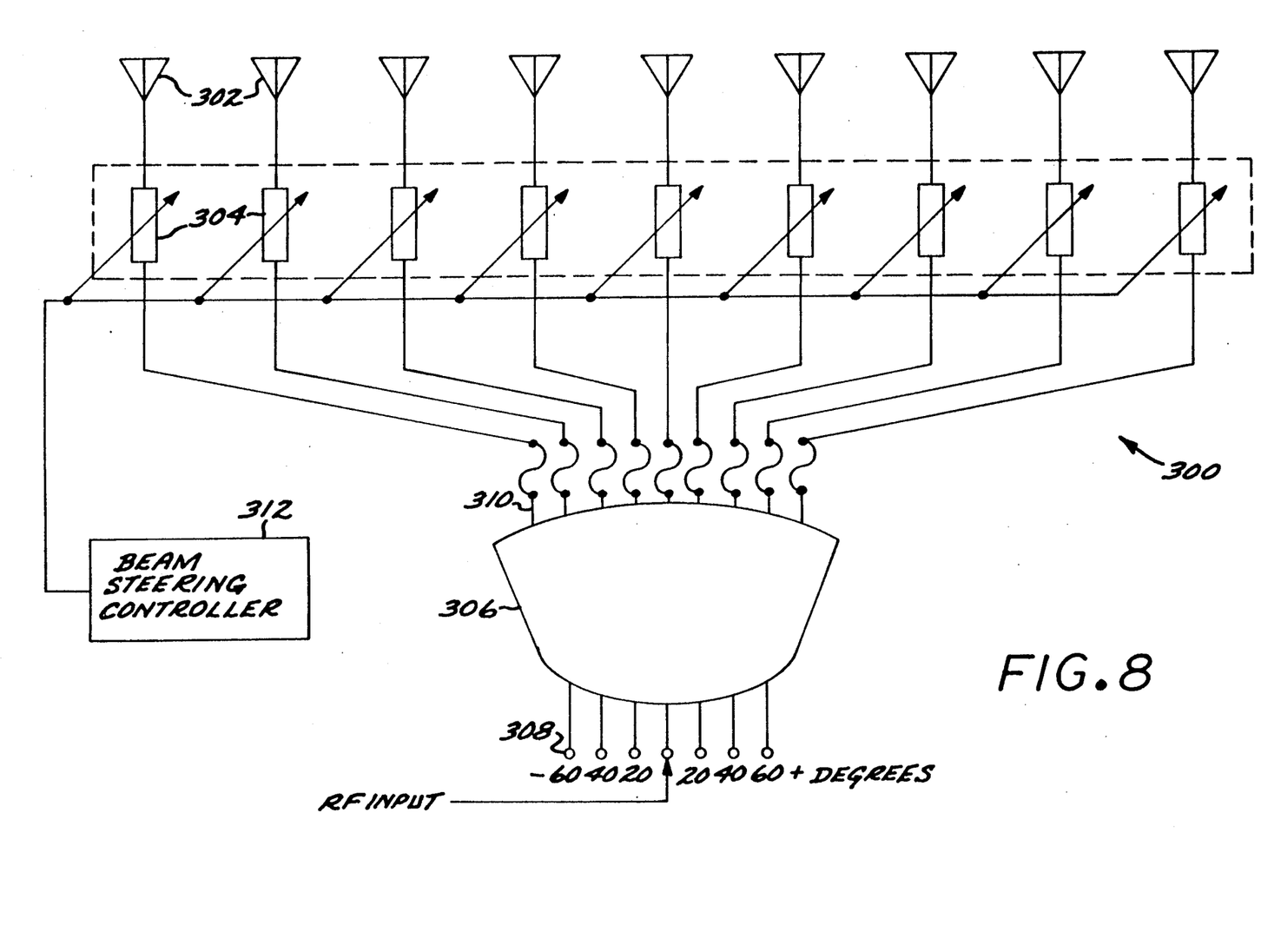
FIG. 8 is a simplified schematic block diagram of a phased array antenna system employing a coarse non-dispersive beam former and a plurality of non-dispersive phase shifters in accordance with the invention.

FIG. 8 discloses a phased array antenna system 300 which employs a non-dispersive coarse-incrementable beam steering time-delay network 306 in conjunction with a plurality of variable phase shift devices 304, to achieve very small incremental adjustment of the antenna beam pointing direction. The network 306 may comprise, for example, a Rotman beamformer. The beamformer 306 includes a plurality of input terminals 308, each corresponding to a particular antenna beam direction, in this example providing discrete beamsteering angles of −60, −40, −20, 0, 20, 40 and 60 degrees (from broadside). The RF input signal is connected to the particular input which steers the beam to a particular desired one of the possible discrete beam directions. The N outputs 310 of the beamformer network 306 are coupled to ports of the respective corresponding N variable phase shift devices 304. Instead of a Rotman lens, the network 306 could comprise an RF feed manifold as in FIG. 7, and a plurality of multi-bit switched line phase shifters, controlled by the beam steering controller to provide the coarse beam steering.

The N radiating elements 302 are in turn connected to ports of respective ones of the variable phase shift devices 304. The devices 304 comprise non-dispersive variable phase shift devices in accordance with the present invention. The beam steering controller 312 is coupled to each of the phase shift devices 304 to provide the appropriate reverse bias control voltage to each device 304 to achieve the phase shift desired through the particular device. In this embodiment, to achieve fine, incremental control of the beam position, the devices 304 will typically be configured to provide the same (variable) phase shift to steer the beam to a desired angle.

Phase shift devices in accordance with the invention can be fabricated so that they are of extremely small physical size. This small size, coupled with the phase shifter's wideband performance characteristics, make this device suitable for achieving the 0.328 inch lattice spacing that is required for an active array antenna which operates at frequencies up to 18 GHz, in order to scan +/− 60 degrees in both the azimuth and elevation planes with polarization diverse signals. The dimension of 0.328 inch correspond to one-half wavelength at 18 GHz, and is the maximum permissible spacing between adjacent antenna radiating elements, without generating grating lobes, when scanning the antenna beam +/−60 degrees.

The device described hereinabove is useful not only as a non-dispersive phase shifter, but also as a transmission line whose effective electrical length can be selectively varied, by adjusting the reverse bias voltage control signal. This means that the transmission line can be electronically programmed to any desired length within its design constraints. The device can therefore be used, for example, as an impedance matching device at a specific frequency(s). This is of value in such applications as maximizing the efficiency of wideband amplifiers, filters, or any devices, active or passive, that are interconnected by a transmission line. Another significant application is to use the device to achieve a perfect impedance match to a phase array's radiating elements, at any spatial angle within the scan sector of the array. This would result in a significant reduction in the array's Radar Cross Section. To date there has not been an effective means for achieving such a goal.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. A low-loss, non-dispersive microwave frequency variable phase shift device operable over a wide frequency bandwidth, wherein the amount of phase shift is selectable over a predetermined range by an external voltage control signal and is linearly proportional to frequency, comprising:
   a length of transmission line comprising first and second conductors, said transmission line having an intrinsic distributed capacitance;
   a plurality of varactor diodes, each characterized by an anode and a cathode, connected periodically in parallel between said first and second conductors, said varactor diodes connected anode to cathode between said first and second transmission conductors, thereby placing the diodes in parallel with the intrinsic distributed capacitance of the transmission line and wherein said varactor diodes are characterized by a "Q" of at least 70,000 at 50 MHz;
   means for applying an external voltage control signal to said diodes to provide a reverse bias on said diodes, said means for applying a selectable reverse bias level within a predetermined reverse bias range, whereby changing the reverse bias applied to the varactor diodes changes the capacitance of the diodes, thereby also producing a corresponding change in the phase constant of the transmission line and providing a relative phase shift; and
   wherein said means for applying said external control signal is operated to limit the magnitude of the capacitance change to limit the magnitude of changes in the characteristic impedance to prevent significant impedance mismatches between the phase shift device and circuitry to which the phase shift device is connected.

2. The phase shift device of claim 1 wherein said transmission line comprises a microstrip transmission line comprising a microstrip conductor and a microstrip ground plane, wherein said first conductor comprises said microstrip conductor and said second conductor comprises said microstrip ground plane.

3. The phase shift device of claim 2 wherein said varactor diodes comprise discrete varactor diode chips, wherein the anodes and cathodes of the diode chips are connected to the respective conductors by conductive elements.

4. The phase shift device of claim 2 wherein said microstrip transmission line is further characterized by a substrate of semiconductor material disposed between said ground plane and said microstrip conductor, wherein said varactor diodes comprises discrete varactor diodes formed by ion implantation into said substrate to form a varactor diode zone in said substrate, and wherein said microstrip conductor is deposited on said substrate over said varactor diode zone.

5. The phase shift device of claim 4 wherein said semiconductor material comprises gallium arsenide.

6. The phase shift device of claim 1 wherein said frequency band is between 6 and 18 GHz.

7. A low-loss, non-dispersive microwave frequency device of variable electrical length is selectable over a predetermined range by an external voltage control signal and is linearly proportional to frequency, comprising:
   a length of transmission line comprising first and second conductors, said transmission line having an intrinsic distributed capacitance;
   a plurality of varactor diodes, each characterized by an anode and a cathode, connected periodically in parallel between said first and second conductors, said varactor diodes connected anode to cathode between said first and second transmission line conductors, thereby placing the diodes in parallel with the intrinsic distributed capacitance of the transmission line and wherein said varactor diodes are characterized by a "Q" of at least 70,000 at 50 MHz; and
   means for applying an external voltage control signal to said diodes to provide a reverse bias on said diodes, said means for applying a selectable reverse bias level within a predetermined reverse bias range, whereby changing the reverse bias applied to the varactor diodes changes the capacitance of the diodes, thereby also producing a corresponding change in the phase constant of the transmission line and providing a relative change in the device electrical length; and wherein said means for applying said external control voltage is operated to limit the magnitude of the capacitance change to limit the magnitude of changes in the characteristic impedance to prevent significant impedance mismatches between the device and circuit to which it is connected.

8. The device of claim 7 wherein said transmission line comprises a microstrip transmission line comprising a microstrip conductor and a microstrip ground plane, wherein said first conductor comprises said microstrip conductor and said second conductor comprises said microstrip ground plane.

9. The device of claim 8 wherein said varactor diodes comprise discrete varactor diode chips, wherein the anodes and cathodes of the diode chips are connected to the respective conductors by conductive elements.

10. The device of claim 8 wherein said microstrip transmission line is further characterized by a substrate of semiconductor material disposed between said ground plane and said microstrip conductor, wherein said varactor diodes comprises varactor diodes formed by ion implantation into said substrate to form a varactor diode zone in said substrate, and wherein said microstrip conductor is deposited on said substrate over said varactor diode zone.

11. The device of claim 10 wherein said semiconductor material comprises gallium arsenide.

12. The device of claim 7 wherein said frequency band is between 6 and 18 Ghz.

13. A phased array antenna system operable over a wide frequency bandwidth for generating an array beam whose position may be steered to any position within a predetermined beam scan width, comprising:
a plurality of radiating elements;
a coarse non-dispersive beam steering network for steering the array beam to a selected one of a discrete group of possible beam positions within the beam scan width;
a plurality of low-loss, non-dispersive variable phase shifter devices coupled to each of the radiating elements for achieving fine incremental control of the beam position about said discrete group of beam positions, each device comprising:
a length of transmission line comprising first and second conductors, said transmission line having an intrinsic distributed capacitance;
a plurality of varactor diodes, each characterized by an anode and a cathode, connected periodically in parallel between said first and second conductors, said varactor diodes connected anode to cathode between said first and second transmission line, thereby placing the diodes in parallel with the intrinsic distributed capacitance of the transmission line; and
means for applying an external voltage control signal to said diodes to provide a reverse bias on said diodes, said means for applying a selectable reverse bias level within a predetermined reverse bias range;
whereby changing the reverse bias applied to the varactor diodes changes the capacitance of diodes, thereby also producing a corresponding change in the phase constant of the transmission line and providing a relative phase shift which is continuously variable over a predetermined range; and wherein said means for applying said external control signal is operated to limit the magnitude of the capacitance change to limit the magnitude of changes in the characteristic impedance to prevent significant impedance mismatches between the phase shift device and circuitry to which the phase shifter device is connected.

14. The phased array system of claim 13 wherein said coarse beam steering network comprises a Rotman lens.

15. The system of claim 13 wherein said frequency band is between 65 and 18 Ghz.

16. The system of claim 13 wherein said varactor diodes are characterized by a "Q" of at least 70,000 at 50 Mhz.

17. The phase array antenna system of claim 13 wherein said transmission line comprises a microstrip transmission line comprising a microstrip conductor and microstrip ground plane, wherein said first conductor comprises said microstrip conductor and said second conductor comprises said microstrip ground plane.

18. The phase array antenna system of claim 17 wherein said microstrip transmission line is further characterized by a substrate of semiconductor material disposed between said ground plane and said microstrip conductor, wherein said varactor diodes comprise varactor diodes formed by ion implantation into said substrate to form a varactor diode zone in said substrate, and wherein said microstrip conductor is deposited on said substrate over said varactor diode zone.

19. The phase array system of claim 18 wherein said semiconductor material comprises gallium arsenide.

20. A phased array antenna system, comprising:
a plurality of radiating elements;
a plurality of transmit/receive modules each having a first port and a second port, said first port coupled to a corresponding one of the radiating elements;
a plurality of low-loss, non-dispersive variable phase shift devices, each device having a first port and a second port, the first port of each device between coupled to the second port of a corresponding transmit/receive modules, said phase shift devices being responsive to respective beam steering control signals to select the phase shift associated with the respective device at a given frequency within a wide frequency band;
an RF feed manifold comprising a first port for receiving an input RF signal and a plurality of second ports, each second port being coupled to a second port of a corresponding phase shift device; and
a beam steering controller for generating said phase shift device control signals to steer the beam in a desired direction;
wherein said phase shift devices are further characterized as comprising:
a length of transmission line comprising first and second conductors, said transmission line having an intrinsic distributed capacitance;
a plurality of varactor diodes, each characterized by an anode and a cathode, connected periodically in parallel between said first and second conductors, said varactor diodes connected anode to cathode between said first and second transmission line, thereby placing the diodes in parallel with the intrinsic distributed capacitance of the transmission line; and wherein said beam steering control signals select the reverse bias voltage applied to said varactor diodes, the magnitude of said bias voltages being limited to limit the magnitude of changes in the capacitance of the diodes and accordingly limit the magnitude of changes in the characteristic impedance of the transmission line to prevent substantial impedance mismatches between the phase shift device and circuitry to which the phase shift device is connected;

wherein changing the reverse bias applied to the varactor diodes changes the capacitance of diodes, thereby also producing a corresponding change in the phase constant of the transmission line and providing a relative phase shift.

21. The system of claim 20 wherein said frequency band is between 6 and 18 Ghz.

22. The system of claim 20 wherein said varactor diodes are characterized by a "Q" of at least 70,000 at 50 Mhz.

* * * * *